US006079514A

United States Patent [19]

Zingali

[11] Patent Number: 6,079,514

[45] Date of Patent: Jun. 27, 2000

[54] ACOUSTIC HORN TRANSDUCER WITH A CONIC TYPE DIFFUSER HAVING AND EXPONENTIAL PROFILE IN WOOD

[75] Inventor: Giuseppe Zingali, Aprilia, Italy

[73] Assignee: Zingali S.N.C., Aprilia, Italy

[21] Appl. No.: 08/952,838

[22] PCT Filed: May 29, 1996

[86] PCT No.: PCT/EP96/02301

§ 371 Date: Jan. 8, 1998

§ 102(e) Date: Jan. 8, 1998

[87] PCT Pub. No.: WO96/38834

PCT Pub. Date: Dec. 5, 1996

[30] Foreign Application Priority Data

May 30, 1995 [FI] Finland ............................ T095A0446

[51] Int. Cl.[7] ...................................................... H05K 5/00

[52] U.S. Cl. ............................................ 181/152; 181/192

[58] Field of Search .................................... 181/152, 159, 181/177, 180, 182, 192; 381/342, 386, 182

[56] References Cited

U.S. PATENT DOCUMENTS

| | | | |
|---|---|---|---|
| 2,873,812 | 2/1959 | Avedon | 181/159 |
| 4,031,337 | 6/1977 | Okamura et al. | 181/159 |
| 4,206,831 | 6/1980 | Welch et al. | 181/159 |
| 4,673,057 | 6/1987 | Glassco | 181/152 |
| 5,889,876 | 3/1999 | Billings | 381/342 |

*Primary Examiner*—Khanh Dang
*Attorney, Agent, or Firm*—Levine & Mandelbaum

[57] ABSTRACT

An acoustic horn transducer with a conic type diffuser has an exponential profile. The diffuser is formed from wood and has an axial length less than its maximum outer diameter.

7 Claims, 2 Drawing Sheets

ACOUSTIC HORN TRANSDUCER WITH A CONIC TYPE DIFFUSER HAVING AND EXPONENTIAL PROFILE IN WOOD

BACKGROUND OF THE INVENTION

The present invention relates to an acoustic horn transducer. It is known that in the greater part of acoustic reproduction systems for high fidelity and for professional use, it is convenient to divide the audio range that is comprised between 20 Hz and 20000 Hz in numerous ways, using different types of acoustic transducers, applying the most suitable so as to reproduce the range of frequencies in the most correct way possible; for example a "woofer" loudspeaker is used for the lounger frequencies, a "midrange" loudspeaker for the medium frequencies and a "tweeter" loudspeaker for the high frequencies.

Conventional horn transducers offer, if compared to dome type transducers, the fundamental characteristic of projecting the sound with greater speed through the air, but with a punctiform image and often with a nasal timbre, making the entire system not very pleasant to listen to; on the contrary dome transducers have a good sound emission, but with lower sonorous impact, of "low efficiency", thus making rather approximate the sonority and the timbre dynamics of musical instruments.

SUMMARY OF THE INVENTION

The aim of the present invention is that of indicating how it is possible to realise an acoustic horn transducer which represents an improvement of the known devices.

For reaching such aim the present invention has as its subject an acoustic transducer as hereinafter described.

Further characteristics and advantages of the acoustic transducer according to the invention will result in being clear from the description that follows and from the annexed drawings, supplied purely as an explanatory and non-limiting example, wherein:

DESCRIPTION OF THE PREFERRED EMBODIMENT

After detailed studies and research the applicant has perfected a new transducer system for the sole reproduction of the medium high frequencies in order to realise two-way sonorous reproduction systems, that confer to the acoustic reproduction system the fundamental characteristic of remarkably reducing the cross distortions between the "midrange" loudspeaker and the "tweeter" loudspeaker that, as is known, reproduce the medium high part in a reproduction system.

Furthermore such transducers for the sole reproduction of the medium high frequencies, replace the two usual transducers with one only.

Figure 1:
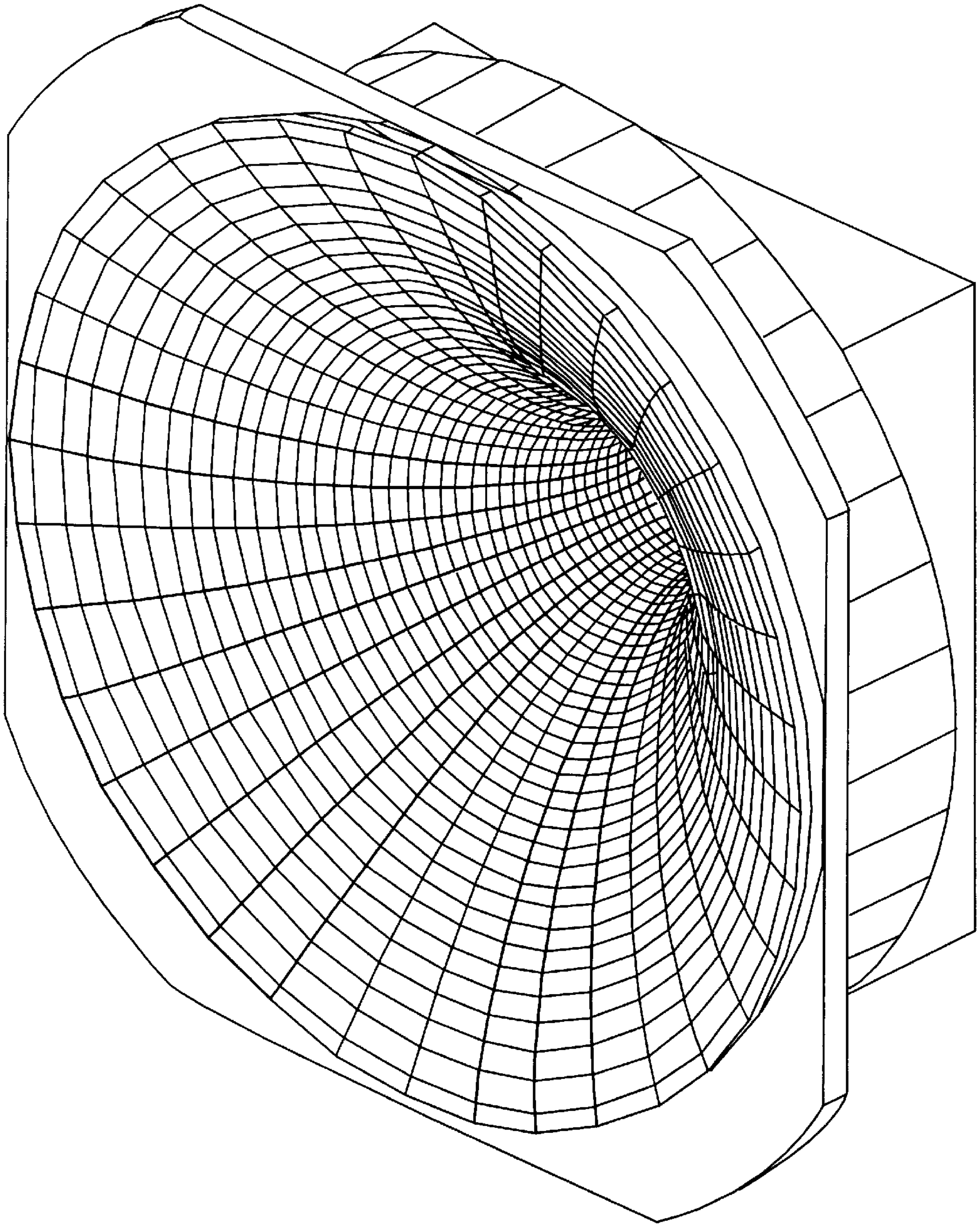
FIG. 1 represents the diffuser (horn) in a three dimensional view according to the invention.
Figure 2:
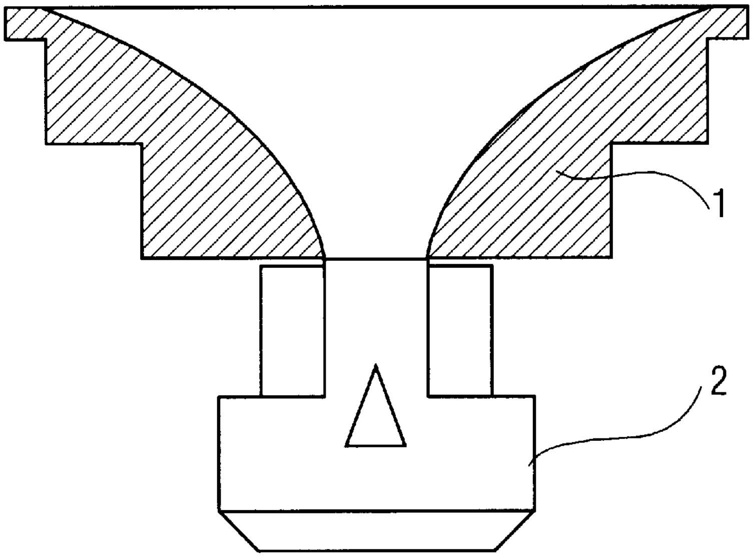
FIG. 2 represents a sectioned view of the complete transducer with the wooden horn, indicated with number 1, and the "driver", indicated with number 2.
Figure 3:
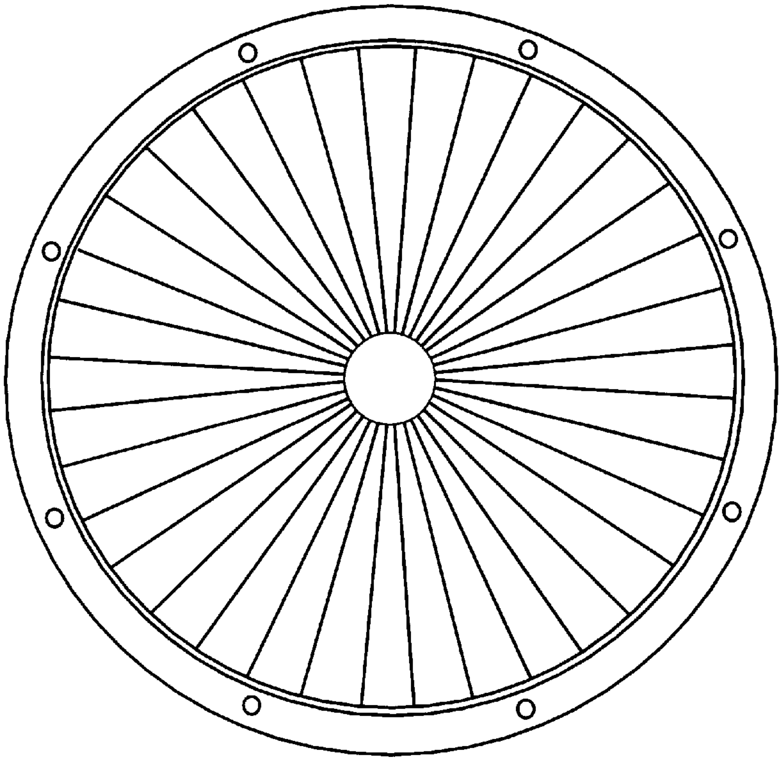
FIG. 3 represents a plan view of the transducer seen from above.

As a consequence of the drawbacks of the aforementioned transducers the applicant has perfected a new transducer with a wooden horn having the following characteristics:

a) the constructive material used for the diffuser or horn is wood without knots, inasmuch it is the only material that is able to give the transducer the most correct timbre possible (nobody has ever seen a violin in a plastic or metallic material);

b) the conic profile of the exponential type being of 360° of the wooden diffuser 1 (note in particular the curve of the exponential type described in FIG. 2) confers to the transducer the characteristic of radiating sounds in an uniform and constant way;

c) thanks to the constructive profile of the diffuser, and to the material used, the typical resonance has been eliminated in the range of frequencies that go from 1000 Hz to 2000 Hz which confers to the conventional horn systems the typical nasal sound and punctiform.

Together the constructive characteristics of the transducer according to the invention (diffuser with a conic profile of the exponential type being of 360° realised in knotless wood) confer to the transducer, as resulting from exhaustive practical listening tests with all kinds of music and with sounds coming from live microphonic recordings, a reproduction of very high timbre quality and of dynamics being very near that offered by musical instruments listened to live.

The realisation of the wooden horn is carried out starting from a single wooden block, appropriately working it on a lathe, until its profile is that as shown in FIG. 2. As can be seen in FIG. 2, the maximum diameter of the wooden horn is greater than its axial length.

It is clear in any case that numerous variations are possible by the skilled-man, to the acoustic horn transducer described as an example, without departing from the novelty principles inherent in the invention. From the many, the possibility is mentioned of realising the diffuser rather than from wood, in plastic or in ferrous materials obtained by fusion, such as aluminium or other materials, of which the working techniques are different from those previously illustrated.

It is clear that other variations can be introduced to the transducer subject of the present invention, without departing from the novelty principles inherent in the innovative idea, as is also clear that in the practical realisation of the invention certain materials and the forms of the illustrated details may be different, and the same may be replaced with technically equivalent elements.

I claim:

1. An acoustic transducer for reproducing sounds in both medium and high audible frequency ranges, said transducer comprising a single horn diffuser having a central axis, a circular cross section when viewed in an axial direction, and a conic exponential profile, the axial length of said diffuser being less than the maximum diameter thereof.

2. An acoustic transducer according to claim 1 where said horn diffuser is formed from wood.

3. An acoustic transducer according to claim 2 where said wood is free of knots.

4. An acoustic transducer according to claim 1 further comprising driver means operatively connected to the horn diffuser at an end of its axis distal from the maximum diameter of the diffuser.

5. An acoustic transducer according to claim 4 wherein the horn diffuser has a throat at said end, said driver means being mounted therebehind.

6. An acoustic transducer according to claim 1 where said horn diffuser is formed from plastic.

7. An acoustic transducer according to claim 1 where said horn diffuser is formed from ferrous metal.

* * * * *